United States Patent [19]

Griesshammer et al.

[11] Patent Number: 4,525,336

[45] Date of Patent: Jun. 25, 1985

[54] PROCESS FOR REMOVING IMPURITIES FROM SILICON FRAGMENTS

[75] Inventors: Rudolf Griesshammer, Altötting; Michael Peterat, Emmerting, both of Fed. Rep. of Germany

[73] Assignee: Wacker-Chemitronic Gesellschaft fur Elektronik Grundstoffe m.b.H., Burghausen, Fed. Rep. of Germany

[21] Appl. No.: 614,529

[22] Filed: May 29, 1984

[30] Foreign Application Priority Data

Sep. 8, 1983 [DE] Fed. Rep. of Germany ....... 3332447

[51] Int. Cl.$^3$ .............................................. C01B 33/02
[52] U.S. Cl. ................................................... 423/348
[58] Field of Search ......................................... 423/348

[56] References Cited

U.S. PATENT DOCUMENTS 3,645,686  2/1972  Tucker ................................ 423/348
4,094,731  6/1978  Keyser et al. ...................... 423/348
4,241,037  12/1980  Pelosini et al. ..................... 423/348

FOREIGN PATENT DOCUMENTS 3129009  2/1983  Fed. Rep. of Germany ...... 423/348

*Primary Examiner*—William R. Dixon, Jr.
*Assistant Examiner*—Steven Capella
*Attorney, Agent, or Firm*—Collard, Roe & Galgano

[57] ABSTRACT

A process for the removal of carbon- and iron-containing impurities from silicon fragments which result when polycrystalline formed silicon bodies produced by vapor phase deposition undergo a crushing treatment. The removal is effected by several steps comprising nitrate treatment, annealing, acid and magnetic treatment, leaving the treated fragments in a state of highest purity that makes them particularly useful in the crucible-pulling process of Czochralski.

9 Claims, No Drawings

PROCESS FOR REMOVING IMPURITIES FROM SILICON FRAGMENTS

The invention relates to the removal of impurities from silicon fragments which result when polycrystalline silicon formed bodies are crushed.

Electronic devices (structural elements) are made in most cases from silicon wafers which are produced by sawing silicon rods resulting from the crucible-pulling process according to Czochralski. In the crucible-pulling process, coarse polycrystalline silicon pieces are melted in crucibles, usually consisting of quartz and, after seeding, the desired crystal is pulled from the melt. The coarse pieces of silicon are mostly obtained by the breaking up or fragmentation of formed bodies of polycrystalline silicon, such as rods, by means of jaw-crushers. The rods are obtained by vapor phase deposition of halogen-silanes, e.g., trichlorosilane, on heated carrier bodies or substrates consisting, e.g., of silicon, graphite or graphite foil (see DE-OS No. 26 18 273 or U.S. Pat. No. 4,160,797).

Silicon fragments, obtained by the crushing step, are only suitable for use in the crucible-pulling method when they have a certain minimum grain size; the limit lies, as a rule, in the sieve fraction of over 8 mm mesh size. Particles of smaller grain size usually exhibit too high a proportion of impurities, e.g., abrasive matter from the crushers, residues from the substrate or electrode materials, or the like. Due to this fact, the sieve fraction below 8 mm is discarded as "waste fragments" amounting to about a 10% loss of material. Moreover, the degree to which the crucibles can be filled is unsatisfactory. Both of these factors result in a poor economical operation of the process.

It is, therefore, the object of the invention to provide a process which permits removal of the impurities from silicon fragments, particularly waste fragments, in such a manner that they will be satisfactory in the use of the crucible-pulling method according to Czochralski.

This object is fulfilled by a process which comprises the following steps:

(a) treating the silicon fragments with an aqueous nitrate solution;
(b) annealing the treated fragments;
(c) treating the annealed pieces with hydrofluoric acid; and, optionally,
(d) removing the iron-containing impurities by the action of an acid or magnetic action, individually or in combination.

This process is generally applicable for silicon fragments, which are obtained by the fragmentation of formed silicon bodies resulting from vapor phase deposition, e.g., rods or tubes, broken up, e.g., by jaw-crushers. Typical impurities in these cases are, on the one hand, iron-containing abrasive matter from the crushers mostly made of steel, and, on the other hand, elementary carbon, e.g., the residue of substrates and/or electrodes, on which the polycrystalline silicon (to be subsequently fragmented or comminuted) was deposited.

In principle, the process does not depend on the grain size of the silicon fragments obtained, it can be used with a great variety of grain sizes. For instance, substrate material adhering to the fraction of high volume silicon fragments deposited on graphite foil can also be removed. When material is deposited on a silicon substrate, the impurities, e.g., the metallic abrasive matter, has by experience been found to be considerably smaller than the major part of the silicon fragments, so that after classification as to grain size, usually only those sieve fractions require purification which are obtained with a mesh size of about 4 mm and, in the case of heavy impurities, about 10 mm. A classification of the material to be purified may also be dispensed with if, e.g., in the case of silicon deposited on graphite foil, traces of substrate material have to be removed from almost every fragment.

The first step in the removal of carbon-containing impurities from the silicon fragments is treatment with an aqueous nitrate solution. Primarily for reasons of expense, either potassium nitrate solution or, preferably, sodium nitrate solution will be used. The nitrates of, e.g., lithium, calcium, strontium, barium, or magnesium are also suitable.

Expediently, the chosen nitrate solution is applied in a concentration of about 30–45% by weight, preferably in almost saturated state, and sprayed or poured over the silicon fragments. However, most favorable is the preparation of a bath of the solution into which the fragments are placed or immersed in order to accomplish a complete wetting from all sides. A further advantage in carrying out this method is the ability to adjust the bath to an elevated temperature by heating devices. It is best to maintain the temperature as high as possible, i.e., near the boiling point of the chosen solution, generally, in the range of about 90°–100° C. As a rule, a period of 5–30 minutes will be sufficient for an effective action of the nitrate solution.

Following the first process step, the silicon fragments wetted by the nitrate solution, are annealed at a temperature of 900°–1300° C., preferably 1000°–1150° C., in the presence of air. Suitable for this purpose are, e.g., resistance-heated or gas-heated furnaces such as the kilns well known and used in the ceramics industries. The time of the annealing treatment decreases with increasing temperatures and normally takes about $\frac{1}{4}$–3 hrs at 1000°–1150° C. During this time the carbon-containing impurities are oxidized and removed from the mixture as carbon monoxide or carbon dioxide. Carbon-free silicon fragments remain as residue coated with a lacquer-like, colorless silicate layer, and, in some cases, the residue also contains at least partly oxidized iron-containing impurities.

After cooling, this residue is subjected to an etching treatment with hydrofluoric acid in order to remove the silicate layer from the silicon fragments. For this purpose, about 20 to 40% by weight, preferably hot hydrofluoric acid is used, e.g., in the form of a bath into which the fragments are placed. A period of about 5–10 minutes is usually required for the effective action of the acid. Subsequently the residue is washed free of acid and dried; it now consists of carbon-free and silicate-free silicon, but it may still contain iron-bearing impurities.

The removal of these impurities can be brought about by different methods. The iron-containing magnetic particles can be separated by magnetic devices, e.g., by means of overhead belt magnetic separator. A second method is chemical separation by dissolving the iron-containing impurities in suitable acids which will not attack elementary silicon, e.g., hydrochloric acid, nitric acid or aqua regia. The chemical purification step requires generally 1–5 hrs. The two methods may be combined, with the acid treatment being applied either before or after the magnetic separation. Finally, the silicon is washed free of acid, dried, and may be used in the crucible-pulling process according to Czochralski. The separation of the iron-containing impurities may, in principle, be carried out after the annealing step and before the treatment with hydrofluoric acid or, preferably, as a first process step before removal of the carbon-containing impurities. It can even be omitted completely if a sieve fraction is used which, due to its grain size, does not contain any iron impurities.

The process according to the invention permits the removal of impurities from polycrystalline silicon which are obtained partly by the deposition step and partly by the subsequent crushing process. The purified silicon can be applied in the crucible-pulling process according to Czochralski without any restriction. This results in a more complete utilization of the valuable deposited silicon base material, as well as in an improvement in the economy of the crucible-pulling process due to the higher crucible capacity.

In the following the invention will be more fully described in a number of examples, but it should be understood that these are given by way of illustration and not by limitation.

EXAMPLE 1

Polycrystalline silicon rods deposited on ultra-pure silicon substrates obtained by vapor phase deposition of trichlorosilane were crushed by jaw crushers. The fragments were classified on a screening device and the fraction, up to a mesh size of 4 mm, was separated. This fraction (weight about 20 kg) the so-called "waste fragments" contained about $5 \cdot 10^{17}$ atoms of carbon-containing impurities per $cm^3$ silicon and, determined by optical examination, about 1000 ppm visible iron-containing impurities, i.e., particles of steel.

First, the silicon fragments were leached for about 2 hours in concentrated hydrochloric acid at about 50° C. in order to eliminate the iron-containing impurities. Subsequently, the product was washed free of acid, placed for about 30 minutes into a bath of approximately 40% by weight of aqueous sodium nitrate solution at about 90° C., and then annealed for about 1 hour in a kiln at approximately 1100° C. After cooling, the lacquer-like silicate layer coating the silicon was removed by etching with concentrated hydrofluoric acid at about 70° C. for about 10 minutes. Thereafter, the product was washed for about 20 minutes with running, desalinated water until it was free of acid and salt and, finally, dried with hot air.

The thus purified silicon fragments had a carbon content of less than $0.5 \cdot 10^{17}$ atoms per $cm^3$ silicon. Iron-containing impurities could no longer be optically determined.

The so-obtained silicon was well adapted for use in the Czochralski crucible-pulling process. Comparison rods pulled according to this process exhibited, as distinguished from rods made from unpurified material, an improved specific resistance by an approximate factor of 50 to 150.

EXAMPLE 2

Polycrystalline silicon deposited by vapor phase deposition of trichlorosilane in the form of rods on substrates of graphite foil were fragmented by jaw-crushers of steel. Passed over a screening device, the fraction below a mesh size 10 mm, in which the abrasive steel particles were present, was separated and discarded.

The remaining fraction (weight about 20 kg) which contained as impurities only adhering residues of graphite foil, was next placed for about 30 minutes in a bath of about 40% by weight of sodium nitrate solution and maintained at 90° C. The material was then taken out and annealed for about 30 minutes in a kiln at approximately 1100° C. Subsequently, the fragments were etched with concentrated hydrofluoric acid of 70° C. for about 10 minutes, then washed free of acid and salt by desalinated water at room temperature and dried with hot air.

After that treatment, the carbon content was $0.5 \cdot 10^{17}$ atoms per $cm^3$ silicon. The silicon could be applied without restriction in the crucible-pulling process of Czochralski.

While only several examples of the present invention have been described, it is obvious that many changes and modifications may be made thereunto, without departing from the spirit and scope of the invention.

What is claimed is:

1. A process for removing impurities from silicon fragments which result when polycrystalline silicon formed bodies are subjected to a crushing treatment, said process comprising the steps of:
   (a) treating the silicon fragments with an aqueous solution of nitrate salts;
   (b) annealing the so-treated fragments; and,
   (c) treating the annealed fragments with hydrofluoric acid.

2. The process of claim 1, additionally including the step of (d) removing iron-containing impurities from said silicon fragments.

3. The process of claim 1, wherein said aqueous nitrate solution is a member selected from the group consisting of sodium nitrate solution and potassium nitrate solution.

4. The process of claim 1, wherein step (b) is carried out at temperatures between 1000° and 1100° C.

5. The process of claim 2, wherein step (d) is effected by treatment in said fragments with a member of the group consisting of hydrochloric acid, nitric acid and a mixture of these acids.

6. The process of claim 2, wherein step (d) precedes steps (a)-(c).

7. The process of claim 2, wherein step (d) is effected by magnetically separating said iron-containing impurities.

8. The process of claim 7, wherein step (d) is effected by both magnetically separating said iron-containing impurities and by heating said fragments with an acid.

9. The process of claim 1, wherein said aqueous solution of nitrate salts, in step (a), is selected from the group consisting of lithium nitrate, calcium nitrate, strontium nitrate, barium nitrate, and mixtures thereof.

* * * * *